United States Patent
Lin et al.

(10) Patent No.: US 12,169,702 B2
(45) Date of Patent: Dec. 17, 2024

(54) IN-MEMORY COMPUTING METHOD AND IN-MEMORY COMPUTING APPARATUS

(71) Applicant: MACRONIX International Co., Ltd., Hsinchu (TW)

(72) Inventors: Bo-Rong Lin, Taichung (TW); Yung-Chun Li, New Taipei (TW); Han-Wen Hu, Tainan (TW); Huai-Mu Wang, New Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 631 days.

(21) Appl. No.: 17/411,938

(22) Filed: Aug. 25, 2021

(65) Prior Publication Data

US 2022/0075601 A1 Mar. 10, 2022

Related U.S. Application Data

(60) Provisional application No. 63/075,309, filed on Sep. 8, 2020.

(51) Int. Cl.
*G06F 7/544* (2006.01)
*G06G 7/16* (2006.01)
(Continued)

(52) U.S. Cl.
CPC .............. *G06F 7/5443* (2013.01); *G06G 7/16* (2013.01); *G11C 7/06* (2013.01); *G11C 7/1006* (2013.01); *G11C 7/1051* (2013.01); *G11C 7/1078* (2013.01)

(58) Field of Classification Search
CPC ........ G06F 7/5443; G06G 7/16; G11C 7/1006
See application file for complete search history.

(56) References Cited

U.S. PATENT DOCUMENTS

| 5,014,235 | A | * | 5/1991 | Morton | ................... | G06F 17/16 |
| | | | | | | 365/185.11 |
| 2016/0247549 | A1 | * | 8/2016 | Takagiwa | ............. | G11C 7/1006 |

(Continued)

FOREIGN PATENT DOCUMENTS

| CN | 108805793 | 11/2018 |
| TW | 201714091 | 4/2017 |

OTHER PUBLICATIONS

Patterson, David A., and John L. Hennessy. Computer Organization and Design, Revised Printing : The Hardware/Software Interface, edited by Peter J Ashenden, Elsevier Science & Technology, 2007. (Year: 2007).*

*Primary Examiner* — Andrew Caldwell
*Assistant Examiner* — Markus Anthony Villanueva
(74) *Attorney, Agent, or Firm* — J.C. PATENTS

(57) ABSTRACT

An in-memory computing method and an in-memory computing apparatus are adapted to perform multiply-accumulate (MAC) operations on a memory by a processor. In the method, a pre-processing operation is respectively performed on input data and weight data to be written into input lines and memory cells of the memory to divide the input data and weight data into a primary portion and a secondary portion. The input data and the weight data divided into the primary portion and the secondary portion are written into the input lines and the memory cells in batches to perform the MAC operations and obtain a plurality of computation results. According to a numeric value of each of the computation results, the computation results are filtered. According to the portions to which the computation results correspond, a post-processing operation is performed on the filtered computation results to obtain output data.

8 Claims, 4 Drawing Sheets

(51) Int. Cl.
*G11C 7/06* (2006.01)
*G11C 7/10* (2006.01)

(56) References Cited

U.S. PATENT DOCUMENTS

| | | | |
|---|---|---|---|
| 2018/0307489 A1* | 10/2018 | Kennedy | G06F 7/5443 |
| 2019/0358515 A1 | 11/2019 | Tran et al. | |
| 2020/0382135 A1* | 12/2020 | Roth | G06F 17/16 |
| 2021/0257017 A1* | 8/2021 | Tsai | G11C 11/4099 |
| 2022/0383915 A1* | 12/2022 | Noguchi | G11C 7/1096 |

* cited by examiner

IN-MEMORY COMPUTING METHOD AND IN-MEMORY COMPUTING APPARATUS

CROSS-REFERENCE TO RELATED APPLICATION

This application claims the priority benefit of U.S. provisional application Ser. No. 63/075,309, filed on Sep. 8, 2020. The entirety of the above-mentioned patent application is hereby incorporated by reference herein and made a part of this specification.

BACKGROUND

Technical Field

The disclosure relates to a computing method and a computing apparatus, and particularly relates to an in-memory computing method and an in-memory computing apparatus.

Description of Related Art

Conventional computing systems are required to perform a lot of computations and frequently transfer data between processors and memories when executing data-intensive applications. Here, performing a lot of computations results in a decrease in system performance, and the frequent transfer of data leads to high power consumption.

In order to solve the issues of limitations to the performance and high power consumption, new algorithms and/or memory schemes including nearest neighbor search, decision tree learning, distributed system, and in-memory computing have been proposed in recent years. However, the decision tree learning still requires the transfer of the significant amount of data, the distributed system has encountered issues of excessively high costs and difficulties in communications between apparatuses, and the in-memory computing cannot support complex computations.

SUMMARY

The disclosure provides an in-memory computing method and an in-memory computing apparatus capable of improving performance of a computing system.

In an embodiment of the disclosure, an in-memory computing method adapted to perform multiply-accumulate (MAC) operations on a memory having a crossbar scheme by a processor is provided. The memory includes a plurality of intersecting input lines and output lines, a plurality of memory cells respectively arranged at intersections of the input lines and the output lines, and a plurality of sensing amplifiers respectively connected to the output lines. In the method, a pre-processing operation is respectively performed on input data and weight data to be written into the input lines and the memory cells to divide the input data and the weight data into a primary portion and a secondary portion. Next, the input data and the weight data divided into the primary portion and the secondary portion are written into the input lines and the memory cells in batches to perform the MAC operations to obtain a plurality of computation results. According to a numeric value of each of the computation results, the computation results are filtered out. According to the portions to which the computation results correspond, a post-processing operation is performed on the filtered computation results to obtain output data.

According to an embodiment of the disclosure, the step of filtering out the computation results according to a numeric value of each of the computation results includes: filtering out the computation results whose numeric values are no greater than a threshold value, sorting the filtered computation results, and selecting at least one computation result sorted first for performing the post-processing operation.

According to an embodiment of the disclosure, the method further includes: when performing the pre-processing operation on the input data and the weight data, performing an encoding operation on the input data and the weight data, and when performing the post-processing operation on the filtered computation results, performing a weighted computation corresponding to the encoding operation on the computation results.

According to an embodiment of the disclosure, the step of performing the weighted computation corresponding to the encoding operation on the computation results includes: in response to the computation results corresponding to the primary portion of the input data and the primary portion of the weight data, multiplying the computation results by a first weight to obtain a first product; in response to the computation results corresponding to the primary portion of the input data and the secondary portion of the weight data, multiplies the computation results by a second weight to obtain a second product; in response to the computation results corresponding to the secondary portion of the input data and the primary portion of the weight data, multiplies the computation results by a third weight to obtain a third product; in response to the computation results corresponding to the secondary portion of the input data and the secondary portion of the weight data, multiplies the computation results by a fourth weight to obtain a fourth product; and accumulating the first product, the second product, the third product, and the fourth product obtained by performing the weighted computation on the computation results and outputting an accumulated result as the output data.

In an embodiment of the disclosure an in-memory computing apparatus that includes a memory and a processor is provided. The memory has a crossbar scheme and includes a plurality of intersecting input lines and output lines, a plurality of memory cells respectively arranged at intersections of the input lines and the output lines, and a plurality of sensing amplifiers respectively connected to the output lines. The processor is coupled to the memory and configured to: respectively perform a pre-processing operation on input data and weight data to be written into the input lines and the memory cells to divide the input data and the weight data into a primary portion and a secondary portion; write the input data and the weight data divided into the primary portion and the secondary portion into the input lines and the memory cells in batches to perform MAC operations, and accumulate sensed values of the sensing amplifiers to obtain a plurality of computation results; according to a numeric value of each of the computation results, filter out the computation results; according to the portions to which the computation results correspond, perform a post-processing operation on the filtered computation results to obtain output data.

According to an embodiment of the disclosure, the primary portion is multi-bit most significant bit (MSB) of data to be processed, and the secondary portion is multi-bit least significant bits (LSB) of the data to be processed.

According to an embodiment of the disclosure, the in-memory computing apparatus further includes a filter configured to filter out the computation results whose numeric values are no greater than a threshold value, where the processor further sorts the filtered computation results and selects at least one computation result sorted first to perform the post-processing operation.

According to an embodiment of the disclosure, the processor further performs an encoding operation on the input data and the weight data when performing the pre-processing operation on the input data and the weight data and performs a weighted computation corresponding to the encoding operation on the computation results when performing the post-processing operation on the filtered computation results.

According to an embodiment of the disclosure, the processor is further configured to: in response to the computation results corresponding to the primary portion of the input data and the primary portion of the weight data, multiply the computation results by a first weight to obtain a first product; in response to the computation results corresponding to the primary portion of the input data and the secondary portion of the weight data, multiply the computation results by a second weight to obtain a second product; in response to the computation results corresponding to the secondary portion of the input data and the primary portion of the weight data, multiply the computation results by a third weight to obtain a third product; in response to the computation results corresponding to the secondary portion of the input data and the secondary portion of the weight data, multiply the computation results by a fourth weight to obtain a fourth product; and accumulate the first product, the second product, the third product, and the fourth product obtained by performing the weighted computation on the computation results and output an accumulated result as the output data.

To make the above mentioned more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
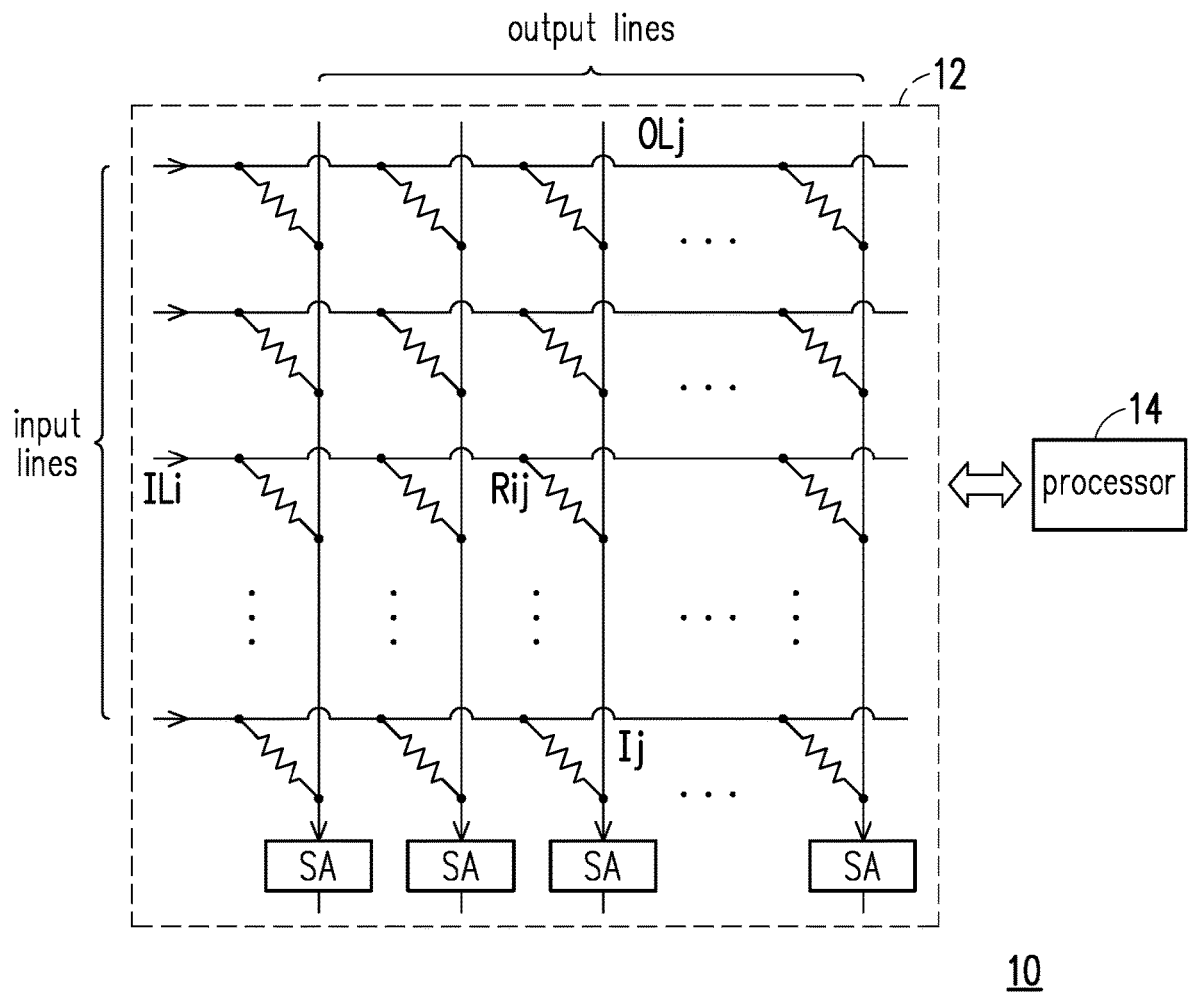
FIG. 1 is a schematic view of an in-memory computing apparatus according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a schematic view of an in-memory computing apparatus according to an embodiment of the disclosure. With reference to FIG. 1, an in-memory computing apparatus 10 provided in this embodiment is, for instance, a memristor which is configured to accomplish process in memory (PIM) and adapted to face search and other data-intensive applications. The computing device 10 includes a memory 12 and a processor 14, functions of which are described below.

The memory 12 is, for instance, an NAND flash memory, an NOR flash memory, a phase change memory (PCM), a spin-transfer torque random access memory (STT-RAM), or a resistive random access memory (ReRAM) having a two-dimensional or three-dimensional structure, which should not be construed as a limitation in the disclosure. In some embodiments, various volatile memories may be integrated, such as a static random access memory (SRAM), a dynamic random access memory (DRAM), and various non-volatile memories, such as a ReRAM, a PCM, a flash memory, a magnetoresistive RAM, and a ferroelectric RAM, so as to perform in-memory computations, which should not be construed as a limitation in the disclosure.

The memory 12 includes a plurality of intersecting input lines $IL_i$ and output lines $OL_j$, a plurality of memory cells (represented by resistors $R_{ij}$) respectively arranged at intersections of the input lines $IL_i$ and the output lines $OL_j$, and a plurality of sensing amplifiers SA respectively connected to the output lines $OL_j$ and configured to sense currents $I_j$ output from the output lines $OL_j$. In some embodiments, the input lines $IL_i$ are word lines, and the output lines $OL_j$ are bit lines, and in some embodiments, the input lines $IL_i$ are the bit lines, and the output lines $OL_j$ are the word lines, which should not be construed as a limitation in the disclosure.

The processor 14 is, for instance, a central processing unit (CPU), another programmable general-purpose or special-purpose microprocessor, microcontroller (MCU), programmable controller, application specific integrated circuit (ASIC), programmable logic device (PLD), another similar device, or a combination of these devices, which should not be construed as a limitation in the disclosure. In this embodiment, the processor 14 is configured to execute commands for performing in-memory operations. The in-memory operations may be implemented in various artificial intelligent (AI) applications, such as fully connected layer, convolution layer, multilayer perceptron, support vector machine, or any other applications implemented with use of the memristor, which should not be construed as a limitation in the disclosure.

Figure 2:
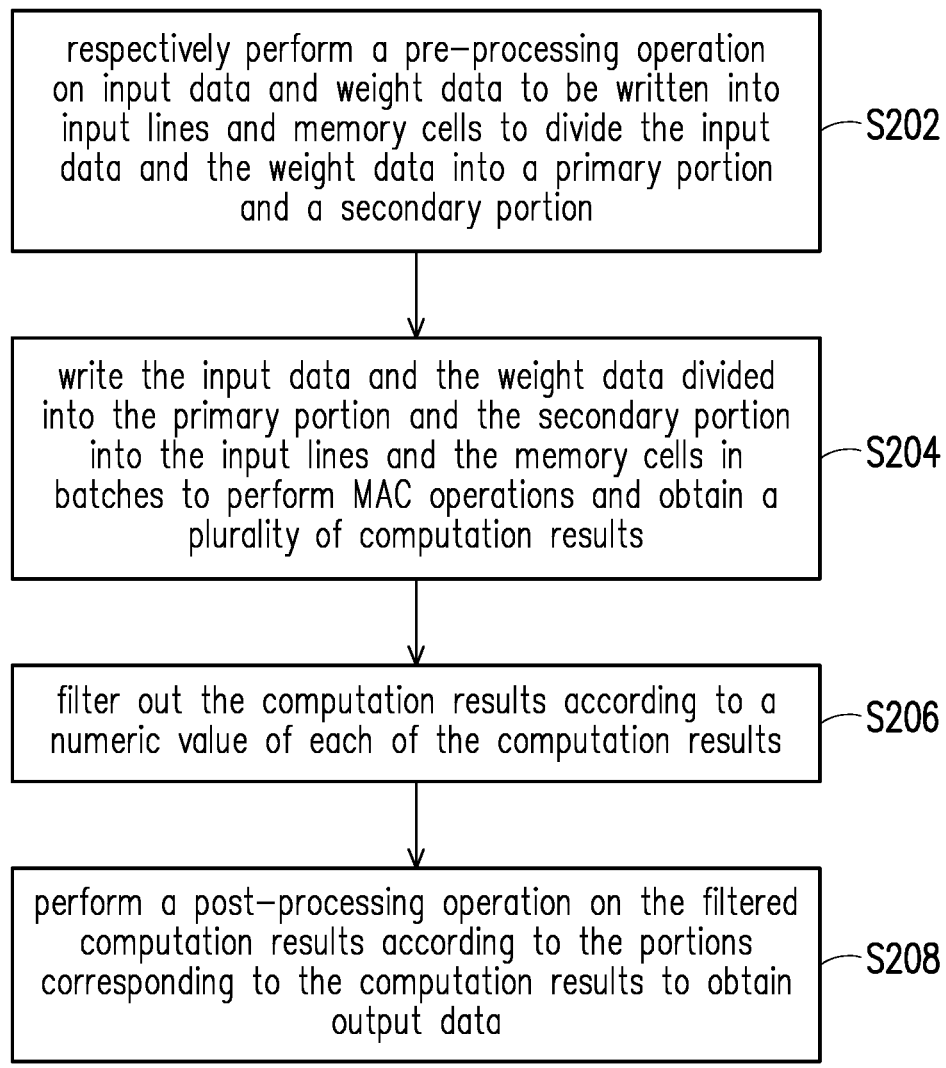
FIG. 2 is a flowchart of an in-memory computing method according to an embodiment of the disclosure.

FIG. 2 is a flowchart of an in-memory computing method according to an embodiment of the disclosure. With reference to FIG. 1 and FIG. 2, the method provided in this embodiment is adapted to the in-memory computing apparatus 10, and detailed steps of an in-memory computing method provided in this embodiment are described below with reference to various devices and components of the in-memory computing apparatus 10.

First, in step S202, the processor 14 respectively performs a pre-processing operation on input data and weight data to be written into input lines and memory cells to divide the input data and the weight data into a primary portion and a secondary portion. In an embodiment, the processor 14 divides the input data into multi-bit most significant bit (MSB) and multi-bit least significant bit (LSB) and also divides the weight data into multi-bit MSB and multi-bit LSB. When the input data are 8 bits, the processor 14 is, for instance, divides the input data into 4-bit MSB and 4-bit LSB and divides the weight data into 4-bit MSB and 4-bit LSB. On other conditions, the processor 14 may divide the input data and the weight data into the same or different numbers of one or more MSBs and one or more LSBs according to actual requirements for implementation, which should not be construed as a limitation in the disclosure. In other embodiments, the processor 14 may mask or filter out one or more insignificant bits (i.e. secondary portion) in the input data, and only keep significant bits (i.e. primary portion) in the input data for subsequent computation, which should also not be construed as a limitation in the disclosure.

In other embodiments, the processor 14 may further encode the input data and the weight data, e.g., convert the multi-bit MSB and the multi-bit LSB of the input data or those of the weight data from a binary format to a unary code (a numeric value format). The processor 14 may then duplicate the converted unary code to unfold it into a dot product format.

Figure 3:
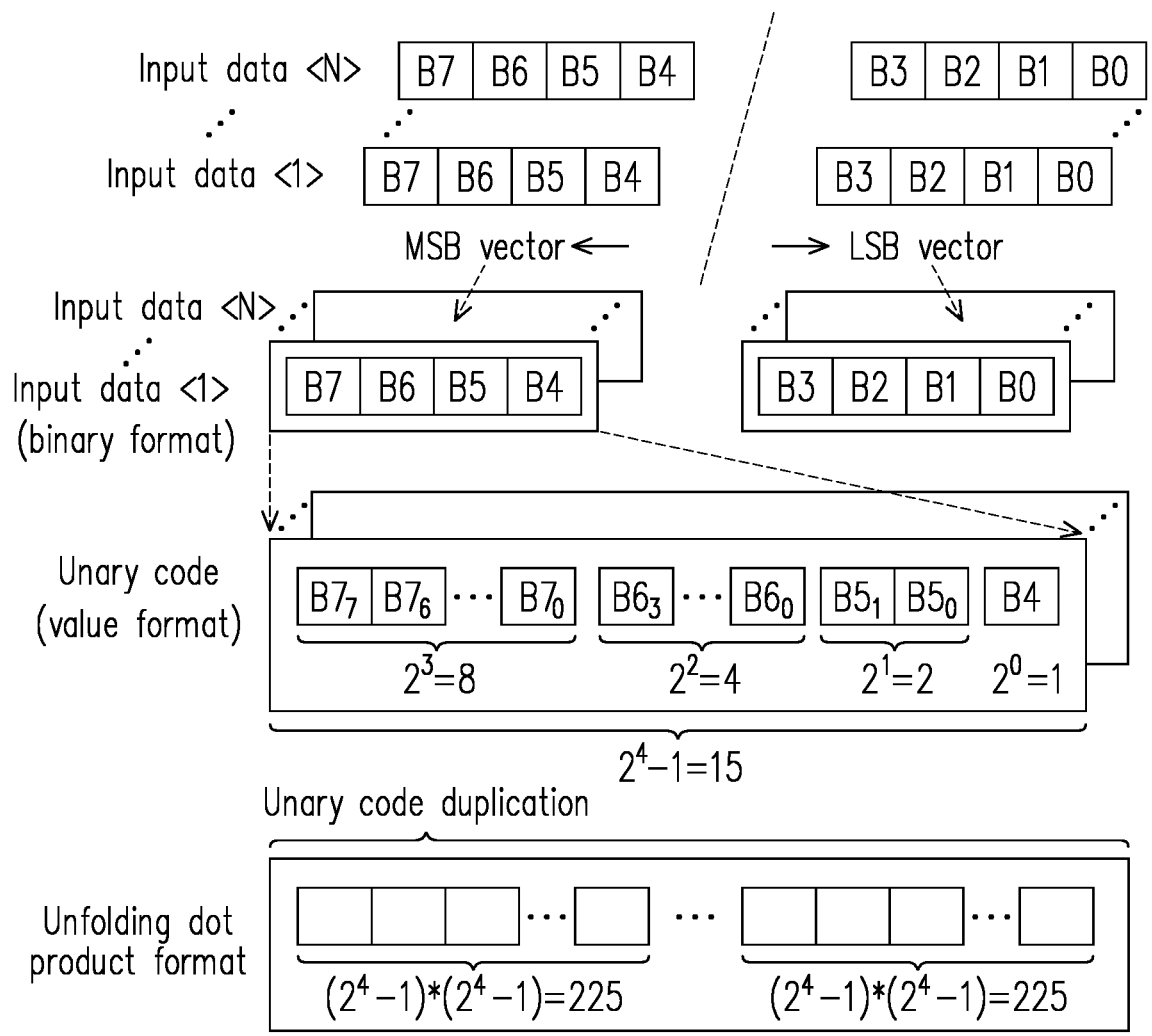
FIG. 3 exemplarily illustrates a data encoding operation according to an embodiment of the disclosure.

FIG. 3 exemplarily illustrates a data encoding operation according to an embodiment of the disclosure. With reference to FIG. 3, in this embodiment, it is assumed that there are N-dimensional input data and weight data to be written, where N is a positive integer, and each of the data has 8 bits B0~B7 expressed in binary. The N-dimensional input data <1>~<N> are taken for example, and each of the input data <1>~<N> are divided into an MSB vector and an LSB vector in this embodiment, wherein the MSB vector includes 4-bit MSB B7~B4, and the LSB vector includes 4-bit LSB B3~B0. Each bit of the MSB vector and each bit of the LSB vector are then converted into unary codes according to numeric values; e.g., the bit B7 is converted to bits $B7_0$~$B7_7$, the bit B6 is converted to bits $B6_0$~$B6_3$, the bit B5 is converted to bits $B5_0$~$B5_1$, and the bit B4 remains unchanged. The converted unary codes are then duplicated and unfolded into the dot product format; for instance, the converted $(2^4-1)$ unary codes of the MSB vector of each of the input data are duplicated $(2^4-1)$ times and unfolded into 225 bits, so as to generate the data in the unfolded dot product format as shown in FIG. 3. Similarly, a pre-processing operation may also be performed on the weight data according to the encoding method of the input data, which will not be further described hereinafter.

As shown in FIG. 2, in step S204, the processor 14 writes the input data and the weight data divided into the primary portion and the secondary portion into the input lines and the memory cells in batches to perform multiply-accumulate (MAC) operations and obtain a plurality of computation results. In detail, the processor 14, for instance, writes the weight data divided into the primary portion into the corresponding memory cells in the memory 12 and inputs the input data divided into the primary portion into the corresponding input lines $IL_i$, in the memory 12, so as to sense the currents $I_j$ output from the output lines $OL_j$ by the sensing amplifiers SA each connected to the output lines $OL_j$; thereby, sensed values of the sensing amplifiers SA are accumulated by a counter or an accumulator, so as to obtain the computation results of the MAC operations performed on the input data and the weight data. Similarly, the processor 14, for instance, writes the weight data divided into the primary portion into the corresponding memory cells in the memory 12 and inputs the input data divided into the secondary portion into the corresponding input lines $IL_i$ in the memory 12, so as to obtain the computation results of the MAC operations; the processor 14 writes the weight data divided into the secondary portion into the corresponding memory cells in the memory 12 and inputs the input data divided into the primary portion into the corresponding input lines $IL_i$ in the memory 12, so as to obtain the computation results of the MAC operations; the processor 14 writes the weight data divided into the secondary portion into the corresponding memory cells in the memory 12 and inputs the input data divided into the secondary portion into the corresponding input lines $IL_i$ in the memory 12, so as to obtain the computation results of the MAC operations.

In some embodiments, the memory 12 may also support other operations such as inverse, logic AND, logic OR, XOR, or XNOR, without being limited to MAC operations. In addition, the memory 12 is not limited to be implemented by digital circuits and may be implemented by analog circuits, which should not be construed as a limitation in the disclosure.

For example, when implemented by digital circuits, the processor 14 may divide the input data into multi-bit MSB and multi-bit LSB (without limiting a number of bits), perform various kinds of encoding (i.e. pre-processing) method on the divided data and input the processed data into the memory 12 for performing inverse, logic AND, logic OR, XOR, XNOR, or MAC operation, or a combination of those operations, and obtain final computation result after performing filtering through corresponding post-processing. When implemented by analog circuits, the processor 14 may mask or filter out (i.e. pre-processing) insignificant bits of the input data, and input the processed data into the memory 12 for performing inverse, logic AND, logic OR, XOR, XNOR, or MAC operation, or a combination of those operations, and obtain final computation result after performing filtering through corresponding post-processing. The above is given as an example, and the processor 14 may perform any kind of pre-processing and post-processing on the input data to obtain a dedicated computation result.

In step S206, the processor 14 filters out the computation results according to a numeric value of each of the computation results. In an embodiment, the in-memory computing apparatus 10 includes, for instance, a filter (not shown) configured to filter out the computation results whose numeric values are no greater than a threshold value. The processor 14 sorts the filtered computation results and selects the N computation results sorted first to perform the post-processing operation. Here, N is, for instance, 3, 5, 10, 20, or any positive integer, which should not be construed as a limitation in the disclosure.

In step S208, the processor 14 performs a post-processing operation on the filtered computation results according to the portions corresponding to the computation results to obtain the output data. In an embodiment, when the processor 14 performs the pre-processing operation on the input data and the weight data, the processor 14, for instance, performs an encoding operation on the input data and the weight data, and when the processor 14 performs the post-processing operation on the filtered computation results, the processor 14 performs a weighted computation corresponding to the encoding operation on the computation results.

In detail, in response to the computation results corresponding to the primary portion of the input data and the primary portion of the weight data, the processor 14 multiplies the computation results by a first weight to obtain a first product; in response to the computation results corresponding to the primary portion of the input data and the secondary portion of the weight data, the processor 14 multiplies the computation results by a second weight to obtain a second product; in response to the computation results corresponding to the secondary portion of the input data and the primary portion of the weight data, the processor 14 multiplies the computation results by a third weight to obtain a third product; in response to the computation results corresponding to the secondary portion of the input data and the secondary portion of the weight data, the processor 14 multiplies the computation results by a fourth weight to obtain a fourth product. Finally, the processor 14 accumulates the first product, the second product, the third product, and the fourth product obtained by performing the weighted computation on the computation results and outputs an accumulated result as the output data.

Figure 4:
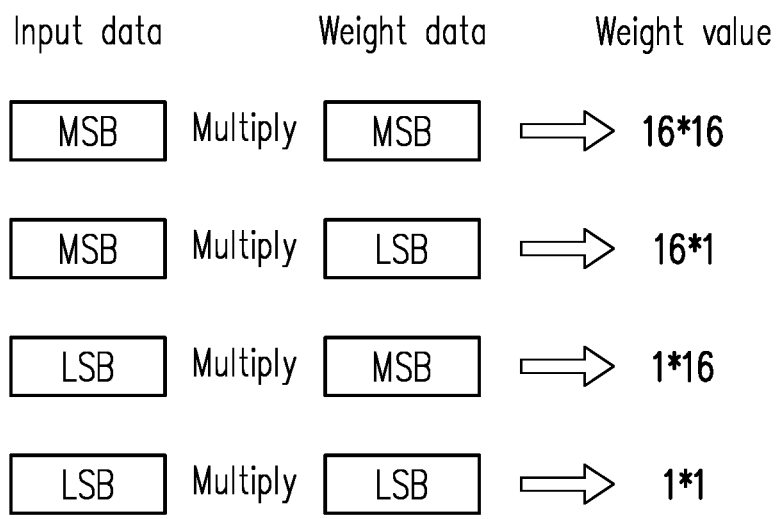
FIG. 4 exemplarily illustrates a data post-processing operation according to an embodiment of the disclosure.

FIG. 4 exemplarily illustrates a data post-processing operation according to an embodiment of the disclosure. With reference to FIG. 4, a post-processing operation corresponding to the encoding method depicted in FIG. 3 is elaborated in this embodiment. Here, in response to the computation results corresponding to the primary portion of the input data (i.e., the MSBs) and the primary portion of the weight data, the corresponding weight value is 16*16; in response to the computation results corresponding to the primary portion of the input data and the secondary portion of the weight data (i.e., the LSBs), the corresponding weight value is 16*1; in response to the computation results corresponding to the secondary portion of the input data (i.e., the MSBs) and the primary portion of the weight data, the corresponding weight value is 1*16; in response to the computation results corresponding to the secondary portion of the input data (i.e., the MSBs) and the secondary portion of the weight data, the corresponding weight value is 1*1. By multiplying the computation results obtained by writing the input data and the weight data into the memory 12 in batches by the corresponding weight values, the computation results of the MAC operations of the original input data and weight data may be restored.

After completing the MAC operation on each input data and weight data and obtaining the computation results, the processor 14 goes back to the step S204 and continues to write the next input data and weight data into the memory 12 for performing the MAC operation until the computation results of all input data and weight data are completely obtained, whereby the in-memory computing operations are completed.

To sum up, in the in-memory computing method and the in-memory computing apparatus provided in one or more embodiments of the disclosure, the in-memory computing operation and a hierarchical filter scheme are combined. Through performing the pre-processing operation on the input data and the weight data to be written into the memory, it is possible to selectively remove the computing operations on the bits which are of lower numeric values (i.e., the LSBs) and give priority to the computing operations on the bits which are of higher numeric values (i.e., the MSBs). Besides, through filtering out the computation results, the corresponding post-data operation may be performed on the computations results of higher numeric values, so as to obtain the final output data. As such, the performance of the computing system may be improved without overly affecting the numeric values of the computation results.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An in-memory computing method, adapted to perform multiply-accumulate (MAC) operations by a processor using a memory, wherein the memory comprises a plurality of intersecting input lines and output lines, a plurality of memory cells respectively arranged at intersections of the input lines and the output lines, and a plurality of sensing amplifiers respectively connected to the output lines, the method comprising:
respectively dividing the input data and the weight data into multi-bit most significant bit (MSB) and multi-bit least significant bit (LSB), converting each bit of the multi-bit MSB and each bit of the multi-bit LSB into unary codes according to numeric values of the bits, and duplicating the converted unary codes to generate input data in an unfolded dot product format and weight data in the unfolded dot product format;
writing the input data in the unfolded dot product format and the weight data in the unfolded dot product format into the input lines and the memory cells in batches, sensing currents output from the output lines by using the plurality of sensing amplifiers to generate sensed values, and accumulating the sensed values of the sensing amplifiers to obtain a plurality of computation results;
filtering out the computation results with numeric values no greater than a threshold value; and
performing a post-processing operation on the filtered computation results according to portions to which the computation results correspond to obtain output data.

2. The in-memory computing method according to claim 1, wherein after the step of filtering out the computation results, the method further comprises:
sorting the filtered computation results and selecting at least one computation result sorted first to perform the post-processing operation.

3. The in-memory computing method according to claim 1, further comprising:
when generating the input data in the unfolded dot product format and the weight data in the unfolded dot product format, performing an encoding operation on the input data and the weight data; and
when performing the post-processing operation on the filtered computation results, performing a weighted computation corresponding to the encoding operation on the computation results.

4. The in-memory computing method according to claim 3, wherein the step of performing the weighted computation corresponding to the encoding operation on the computation results comprises:
in response to the computation results corresponding to the multi-bit MSB of the input data and the multi-bit MSB of the weight data, multiplying the computation results by a first weight to obtain a first product;
in response to the computation results corresponding to the multi-bit MSB of the input data and the multi-bit LSB of the weight data, multiplying the computation results by a second weight to obtain a second product;
in response to the computation results corresponding to the multi-bit LSB of the input data and the multi-bit MSB of the weight data, multiplying the computation results by a third weight to obtain a third product;
in response to the computation results corresponding to the multi-bit LSB of the input data and the multi-bit LSB of the weight data, multiplying the computation results by a fourth weight to obtain a fourth product; and
accumulating the first product, the second product, the third product, and the fourth product obtained by performing the weighted computation on the computation results and outputting an accumulated result as the output data.

5. An in-memory computing apparatus, comprising:
a memory, comprising:
a plurality of intersecting input lines and output lines;
a plurality of memory cells, respectively arranged at intersections of the input lines and the output lines; and a plurality of sensing amplifiers, respectively connected to the output lines and configured to only sense currents output from the output lines to generate sensed values;

a processor, coupled to the memory and configured to:

respectively divide input data and weight data into multi-bit most significant bit (MSB) and a multi-bit least significant bit (LSB), convert each bit of the multi-bit MSB and each bit of the multi-bit LSB into unary codes according to numeric values of the bits, and duplicate the converted unary codes to generate input data in an unfolded dot product format and weight data in the unfolded dot product format;

write the input data in the unfolded dot product format and the weight data in the unfolded dot product format into the input lines and the memory cells in batches, and accumulate the sensed values of the sensing amplifiers to obtain a plurality of computation results;

filter out the computation results with numeric values no greater than a threshold value; and perform a post-processing operation on the filtered computation results according to portions to which the computation results correspond to obtain output data.

6. The in-memory computing apparatus according to claim 5, wherein the processor further sorts the filtered computation results and selects at least one computation result sorted first to perform the post-processing operation.

7. The in-memory computing apparatus according to claim 5, wherein the processor further performs an encoding operation on the input data and the weight data when generating the input data in the unfolded dot product format and the weight data in the unfolded dot product format and performs a weighted computation corresponding to the encoding operation on the computation results when performing the post-processing operation on the filtered computation results.

8. The in-memory computing apparatus according to claim 7, wherein the processor further:

in response to the computation results corresponding to the multi-bit MSB of the input data and the multi-bit MSB of the weight data, multiplies the computation results by a first weight to obtain a first product;

in response to the computation results corresponding to the multi-bit MSB of the input data and the multi-bit LSB of the weight data, multiplies the computation results by a second weight to obtain a second product;

in response to the computation results corresponding to the multi-bit LSB of the input data and the multi-bit MSB of the weight data, multiplies the computation results by a third weight to obtain a third product;

in response to the computation results corresponding to the multi-bit LSB of the input data and the multi-bit LSB of the weight data, multiplies the computation results by a fourth weight to obtain a fourth product; and accumulates the first product, the second product, the third product, and the fourth product obtained by performing the weighted computation on the computation results and outputs an accumulated result as the output data.

* * * * *